United States Patent [19]

Turnbull et al.

[11] Patent Number: 5,498,971
[45] Date of Patent: Mar. 12, 1996

[54] METHOD AND CONTROL CIRCUIT FOR MEASURING THE TEMPERATURE OF AN INTEGRATED CIRCUIT

[75] Inventors: Robert R. Turnbull, Buchanan; David J. DeLisle, Berrien Springs; Robert A. Kohtz, St. Joseph, all of Mich.

[73] Assignee: Zenith Data Systems Corporation, Buffalo Grove, Ill.

[21] Appl. No.: 470,639

[22] Filed: Jun. 6, 1995

Related U.S. Application Data

[63] Continuation of Ser. No. 192,703, Feb. 7, 1994, abandoned.

[51] Int. Cl.⁶ .................................................... G01R 31/00
[52] U.S. Cl. ......................... 324/760; 365/211; 365/222
[58] Field of Search .......................... 324/760; 365/222, 365/211

[56] References Cited

U.S. PATENT DOCUMENTS 3,835,458  9/1974  Mrazek ............................... 340/173 R
4,390,972  6/1983  Machida ................................... 365/222

Primary Examiner—Kenneth A. Wieder
Assistant Examiner—Kourosh Cyrus Khosravi
Attorney, Agent, or Firm—Fitch, Even, Tabin & Flannery

[57] ABSTRACT

A method and circuit for relatively accurately measuring the die temperature of an IC, such as a microprocessor, by sensing one or more internal circuit elements which have an electrical parameter which varies as a function of temperature, such as an input protection diode. By sensing the one or more circuit elements which have an electrical parameter that is temperature dependent, the method provides a relatively more accurate measurement of the die temperature than measuring the outside temperature of the IC package. In addition, a control circuit is provided for cooling the IC during excessive temperature conditions by slowing down the clock frequency of the IC until the die temperature is within the temperature limit in order to optimize the utility of the IC during excessive temperature conditions.

17 Claims, 2 Drawing Sheets

METHOD AND CONTROL CIRCUIT FOR MEASURING THE TEMPERATURE OF AN INTEGRATED CIRCUIT

This application is a continuation, of application Ser. No. 08/192,703 filed Feb. 7, 1994, now abandoned.

BACKGROUND OF THE INVENTION

1. Field of the Invention

The present invention relates to a method and a control circuit for measuring the die temperature of an integrated circuit (IC), such as a microprocessor, that is relatively more accurate than known methods and a control circuit for reducing the clock frequency of the IC during excessive temperature conditions until the temperature returns to normal in order to avoid damage to the IC.

2. Description of the Prior Art

Microprocessors are known to be used in various types of personal computers including notebook and subnotebook computers. The relatively fast clock speeds of the newer microprocessors cause the temperature of the microprocessor to get relatively hot. Due to the relatively compact nature of the notebook and subnotebook personal computers, very little ventilation is available within the computer housing to cool down the microprocessors.

Many integrated circuits (IC), particularly microprocessors, are known to have a die temperature limit of about 100° C. The die temperature relates to the temperature of the die or semiconductor chip that is normally bonded to an outer IC package which includes the terminal pins chip. Die bonding refers to the process in which the semiconductor chip is bonded to a thick film substrate or a base of the outer IC package. Various die bonding methods are known including eutectic alloying, soft soldering and plastic adhesives.

In order to prevent a failure or misoperation of the semiconductor chip or a failure of the bond between the semiconductor chip and its outer IC package, the die temperature of many ICs must be maintained at less than about 100° C. Since the die is within the IC package, there is heretofore been no way to measure the die temperature. As such, an outside surface temperature of the IC package has heretofore been used as an empirical approximation of the die temperature. For example, due to the thermal drop across the outer IC package, an outside surface IC temperature of about 80° C. has been used as an approximation of the 100° C. die temperature limit within the IC package. However, such an estimation is empirical and, thus, relatively inaccurate which could lead to failure of the integrated circuit.

Notwithstanding the inaccuracy of such a measurement, other problems result from measuring the outside surface temperature of the IC package. For example, in order to measure the outside surface temperature of the integrated circuit package, a thermistor or other temperature sensing device is known to be used and disposed to be in contact with the outer IC package. Such devices, in addition to adding to the cost of the personal computer in which they are used, require additional space; normally at a premium within the relatively compact notebook and subnotebook type personal computers.

SUMMARY OF THE INVENTION

It is an object of the present invention to solve various problems of the prior art.

It is another object of tile present invention to provide a method and circuit for relatively accurately measuring the die temperature of an integrated circuit (IC).

It is yet a further object of the present invention to provide a method and circuitry for measuring the die temperature of an IC which does not require additional space within a personal computer.

Briefly, the present invention relates to a method and circuit for relatively accurately measuring the die temperature of an IC, such as a microprocessor, by sensing one or more internal circuit elements which have an electrical parameter which varies as a function of temperature, such as an input protection diode. By sensing the one or more circuit elements which have an electrical parameter that is temperature dependent, the method provides a relatively more accurate measurement of the die temperature than measuring the outside temperature of the IC package. In addition, a control circuit is provided for cooling the IC during excessive temperature conditions by slowing down the clock frequency of the IC until the die temperature is within the temperature limit in order to optimize the utility of the IC during excessive temperature conditions.

DESCRIPTION OF THE DRAWINGS

These and other objects of the present invention will be readily apparent from the following description and attached drawings wherein.

DETAILED DESCRIPTION OF THE PREFERRED EMBODIMENT

The method and control circuit in accordance with the present invention provide a relatively simple way to measure the die temperature of a semiconductor chip within an integrated circuit (IC) package without the need to measure the outer surface temperature of the IC package. In addition, the present invention further utilizes the die temperature to regulate the clock frequency of the IC. More particularly, when the die temperature is above a predetermined temperature limit, the system in accordance with the present invention reduces the input clock frequency of the IC in order to limit the internal die temperature. Once the internal die temperature is within acceptable temperature limits, the control circuit in accordance with the present invention in one embodiment increases the clock frequency to the IC in order to provide optimum performance of the IC even during excessive internal die temperature conditions.

As mentioned above, various IC manufacturers have set a temperature limit for the internal die temperature within an IC package. However, none of the manufacturers have heretofore been known to provide a means for measuring the internal die temperature. Since the die is disposed within an IC package, there is no means for accessing the die. As such, various temperature measurement devices, such as thermistors, have been attached to the outer surface of the IC package in order to provide an indication of its surface temperature. However, it is known that the surface temperature of the IC package is a relatively poor approximation of the internal die temperature of the IC.

The die temperature becomes increasingly more important with today's relatively faster microprocessors which operate at frequencies in excess of 66 MHz. In addition, the application of such relatively fast microprocessors in applications such as notebook and subnotebook computers further complicates the problem. In particular, in such applications, the areas available within the notebook and subnotebook housings are relatively compact. As such, very little ventilation is available for transporting heat away from the IC. In addition, very little room is available for attaching temperature sensitive devices to the external surface of the IC.

The method and control circuit in accordance with the present invention solve these problems by taking advantage of various circuit elements within the IC which have an electrical parameter which varies with temperature. For example, internal input protection diodes are common on virtually all complementary metal oxide semiconductor (CMOS) ICs. These internal protection diodes provide protection for the internal circuitry within an IC from damage due to excessive electrostatic discharges, which can sometimes occur during handling and assembly procedures. Such input protection diodes, as well as various other circuit elements having a temperature dependent electrical parameter, are normally connected to various output pins on the IC.

Figures 1, 2:
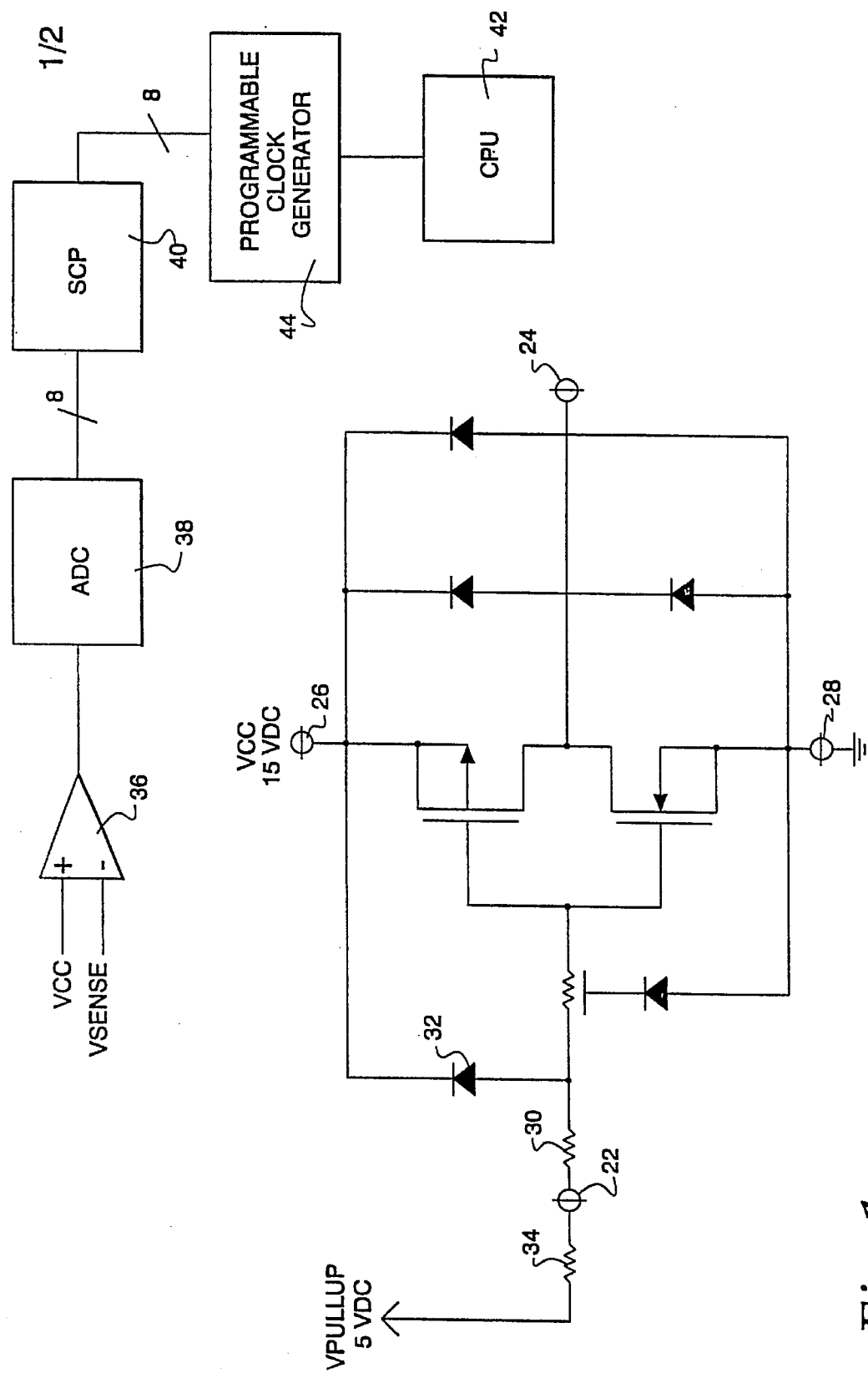
FIG. 1 is a partial schematic diagram of known internal protection circuitry within an integrated circuit (IC) illustrating the input protection diodes, shown connected to a circuit in accordance with the present invention to enable measurement of the voltage across one of the protection diodes.
FIG. 2 is a block diagram of a control system for controlling the clock frequency of an IC.

A typical schematic diagram of the input and output protection circuitry within a typical CMOS microprocessor is illustrated in FIG. 1. The schematic illustrated in FIG. 1 is described in detail in National Semiconductor CMOS Databook, pages 2–84–2–90, copyright 1988, hereby incorporated by reference. Although FIG. 1 illustrates specific input, output and supply pins being used, the invention is not so limited. For example, as shown in FIG. 1, the circuitry shown connected between an input pin 22, an output pin 24, a supply pin 26 and a ground pin 28 includes various circuit elements, such as an input protection diode, whose voltage varies as a function of temperature. In other ICs or applications, various other pins may be used. It is only important that the particular pins be selected to enable the circuit in accordance with the present invention to be able to sense the voltage difference across a circuit element which has an electrical parameter that varies as a function of temperature.

Referring to FIG. 1, the internal circuit includes an input resistor 30 and an input protection diode 32 connected between the input pin 22 and the supply pin 26, as well as various other circuit elements. With the circuit illustrated in FIG. 1, the input protection diode 32 can rather easily be used to provide an indication of the internal die temperature within the microprocessor by sensing the voltage drop across the input protection diode 32, whose voltage varies as a function of temperature. However, in other applications, other circuit elements could also be used. More particularly, with reference to FIG. 1, the supply voltage $V_{cc}$, normally 3.3 volts DC (VDC) or 5 VDC, depending on the particular microprocessor, is applied to the supply pin 26. In order to sense the voltage across the protection diode 32, the voltage $V_{sense}$ at the input terminal 22 is sensed. The difference between the supply voltage $V_{cc}$ and $V_{sense}$ provides an indication of the voltage across the input protection diode 32. Since it is known that the voltage across a diode varies as a function of temperature, this voltage can be used to provide a relatively accurate indication of the die temperature.

In order to generate a voltage at the input pin 22, which may be any pin that is normally pulled high or not used in the particular application, the input pin 22 is pulled high by way of a resistor 34 in accordance with the present invention. A voltage $V_{pullup}$, for example, 15 VDC, is used to pull the input pin 22 high. It is only necessary $V_{pullup}$ be greater than the supply voltage $V_{cc}$ to the supply pin 26 in order to enable the voltage difference across the protection diode 32 to be measured. The use of 15 VDC is illustrated because it is readily available frown the power supply (not shown) within a typical notebook or subnotebook computer.

The magnitude of the pull up voltage $V_{pullup}$ as well as the size of the resistor 34 are selected such that the input current is below the current limit to an input pin, normally specified by the IC manufacturer. Typically, 1–2 milliamps is specified as the current limit to an input pin by the particular IC manufacturer in order to prevent damage to the internal circuitry within the IC. Thus, the magnitude of the pullup voltage $V_{pullup}$ as well as the size of the resistor 34 may be selected to force about 100 microamps into the input terminal 22, which would require that the value of the resistor 34 be about 100 k ohms. In addition, the resistor 34 is also selected to be relatively larger than the internal resistor 30 such any variation in the resistor 30 would have relatively little effect on the voltage at the input terminal $V_{sense}$.

The circuitry which includes the external resistor 34, in accordance with the present invention, as well as the internal resistor 30, fores a voltage divider which forces the voltage at the input pin 22 $V_{sense}$ to be a predetermined fraction of the pullup voltage $V_{pullup}$. The difference between the supply voltage $V_{cc}$, typically 3.3–5 VDC, and $V_{sense}$ provides a relatively good estimate of the voltage across the input protection diode 32. Since the voltage across a diode is a function of temperature, the voltage difference can be used as a relatively simple and accurate measurement of the internal die temperature within an IC.

In order to control the clock frequency of the IC, the voltage difference between $V_{cc}$ and $V_{sense}$ may be applied to a differential amplifier, which may include offset circuitry, for example, a Model No. AD625, as manufactured by Analog Devices and, in turn, to an analog to digital conveyer (ADC) 38. The ADC 38 may be an 8-bit ADC, Model No. ADC0831, as manufactured by National Semiconductor. The output of the ADC 38 may be applied to an 8-bit data bus of a system control processor (SCP) also referred to as a keyboard controller 40. The SCP 40, for example, an Intel type 8052 is commonly available within visually all personal computers. As will be discussed in more detail below, the SCP 40, in turn, will periodically read the output of the ADC 38 and compare the output with a known value representative of the die threshold temperature. The difference between the predetermined die threshold temperature and the actual die temperature, as sensed by measuring the voltage difference between the supply voltage $V_{cc}$ and the sense voltage $V_{sense}$ may then be used to control the input clock frequency to the CPU in order to optimize the operation of the CPU 42 during conditions when the die temperature is relatively high or exceeds the predetermined die temperature limit.

For simplicity, a discrete clock generator 44 and ADC 38 are shown. However, these elements may be available on other semiconductor chips within the personal computer. For example, the ADC may be integral to the keyboard controller 40. All such implementations are contemplated to be within the broad scope of the invention. In addition, a programmable clock generator 44 is illustrated. However, the principles of the present invention are equally applicable virtually any circuit that is capable of providing a selectable clock frequency output.

As mentioned above, various implementations of the control of the clock frequency input to the CPU 42 are contemplated. For example, the SCP 40 may be used to control a programmable clock generator 44, such as a Model No. AV9154-05, as manufactured by AVASEM. Such clock frequency generators 44 are known to have multiple frequency outputs which are multiples of the input frequency. These multiple output frequencies of the clock generator may be selected to optimize the operation of the CPU during excessive die temperature conditions. For example, various equivalent temperature limits can be stored within a look up table (not shown) which, in turn, may be used to select various outputs of the programmable clock frequency generator 44. Alternatively, the SCP 40 may be used to select between a normal clock frequency and a relatively slower clock frequency during such time that the die temperature is determined to be excessive. Once the die temperature returns to normal, the clock frequency input to the CPU may be returned to its normal value.

Figure 3:
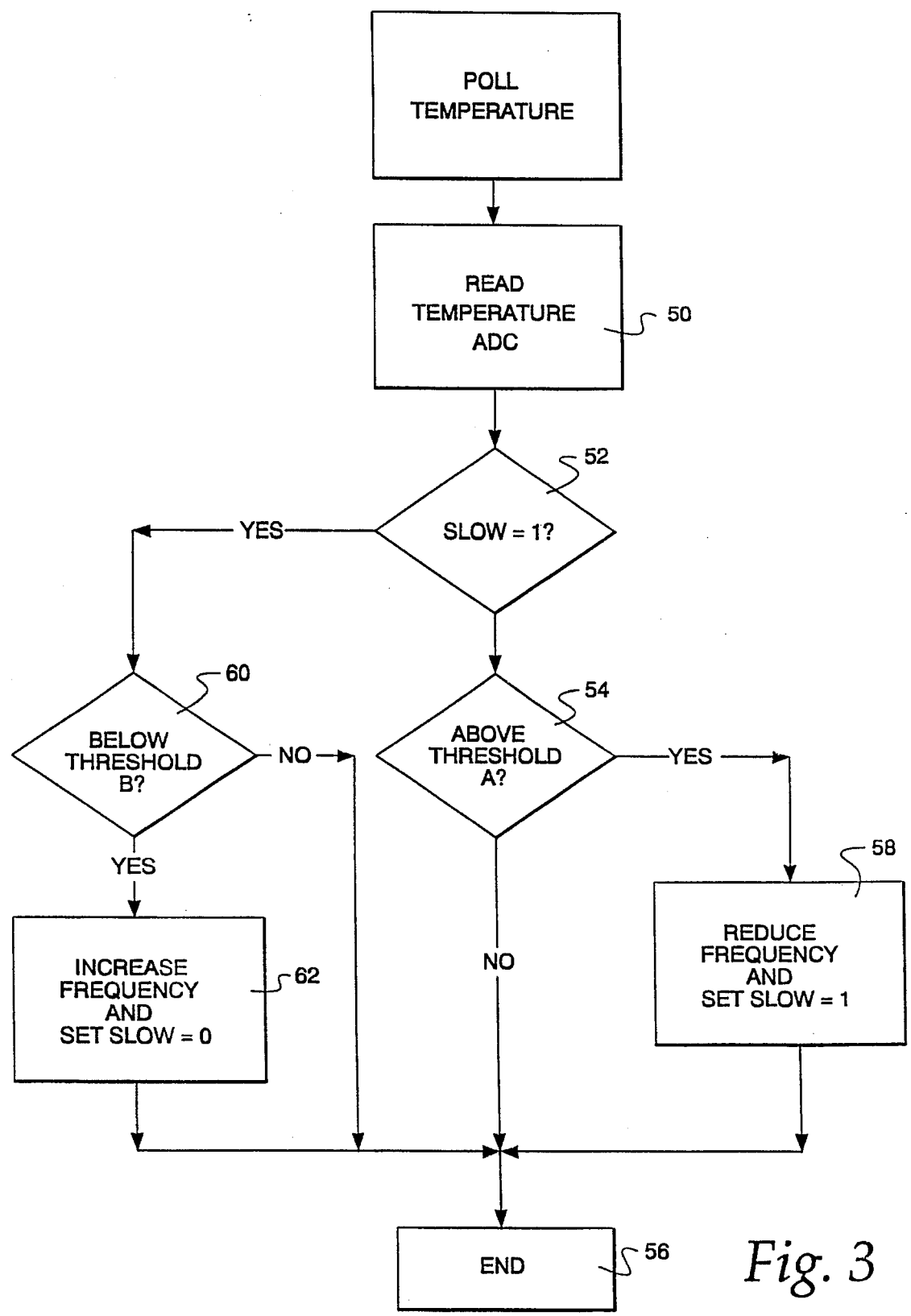
FIG. 3 is a flowchart for the control system illustrated in FIG. 2.

An exemplary flowchart for controlling the input clock frequency to the CPU 42 is illustrated in FIG. 3. For simplicity, the system shown therein illustrates an embodiment wherein the clock frequency to the CPU 42 is reduced to a single value when the temperature is above a predetermined threshold. However, a system which would enable multiple clock frequencies as a function of multiple temperature thresholds is clearly within the scope of the invention.

Referring to FIG. 3, a flowchart for polling the temperature of the microprocessor is illustrated. This flowchart is representative of a subroutine which may be called periodically by the SCP 50. Once the POLL TEMPERATURE subroutine is called, the die temperature is ascertained by reading the value of the ADC 38 in step 50. Once the representative die temperature value 50 is read, the system checks in step 52 to determine if the input clock frequency to the CPU 42 has previously been reduced as a result of excessive die temperature by reading a SLOW flag. If not, the system proceeds to step 54 to determine whether the die temperature read from the ADC 38 is above a predetermined threshold A. In order to prevent the control of the input clock frequency from the CPU from oscillating around the actual threshold temperature, hysterisis is built into the system. In particular, two different temperature thresholds, A and B, may be used to control the input clock frequency. The threshold A may be selected to be greater than the threshold B to prevent oscillation around the threshold temperature. Alternatively, the thresholds A and B can be set equal to each other.

If it is determined that the die temperature, as sensed by reading the ADC 38, is below the threshold A, the input clock frequency to the CPU 42 is left unchanged and the system proceeds to step 56. Alternatively, if the die temperature as sensed by reading the ADC 38 is greater than the threshold A, the SCP 40 forces the programmable clock generator 44 to reduce the frequency to the CPU 42 in step 58. Additionally, a SLOW flag is set. Subsequently, the system proceeds to step 56. Thus, the control system forces the frequency input to the CPU to be lowered when the die temperature is above a predetermined limit.

Since lowering of the input clock frequency to the CPU 42 will result in a decrease of the die temperature, the system also checks during conditions when the CPU is already operating at the lower frequency whether the die temperature falls below the temperature limits. More particularly, in step 52, the system reads the SLOW flag to determine if it is set indicating that the CPU is operating at a reduced clock frequency. If the SLOW flag is set, the system proceeds to step 60 to determine if the die temperature has fallen below a predetermined temperature threshold B. If not, indicating that the die temperature is still excessive, the system proceeds to the end of routine, step 56. However, if the die temperature has fallen below the temperature threshold B, the SCP forces the programmable clock generator 44 to increase the clock frequency input to the CPU 42 and, additionally, clears the SLOW flag in step 62. Thus, the system is able to control the input clock frequency to the CPU 42 as a function of the die temperature, thereby optimizing the operation of the CPU 42 during excessive temperature conditions.

Various methods are contemplated for calibrating the system. In one method, the voltage drop across the protection diode 32 may be measured at room temperature by sensing the voltage difference between the supply voltage $V_{cc}$ and $V_{sense}$. The IC may then be placed in an oven until the temperature of the IC is fairly uniform. The IC may then removed from the oven and connected to the circuit in accordance with the present invention to measure the voltage difference between the supply voltage $V_{cc}$ and $V_{sense}$ to provide two points along a calibration curve to enable the protection diode 32 to be calibrated.

Obviously, many modifications and variations of the present invention are possible in light of the above teachings. Thus, it is to be understood that within the scope of the appended claims, the invention may be practiced otherwise than as specifically designate above.

What is desired to be claimed by a Letters Patent is:

1. A control circuit for measuring the internal die temperature of an integrated circuit (IC) having a predetermined internal circuit element whose voltage varies with temperature connected between predetermined output pins of said IC, said control circuit comprising:

first means for generating a predetermined first voltage at one of said predetermined output pins;

second means for generating a second predetermined voltage at the other of said predetermined output pins;

means for measuring the voltage difference between said first predetermined voltage and said second predetermined voltage to generate a signal representative of the internal die temperature of said IC and means for controlling the clock frequency of said IC as a function of said die temperature representative signal.

2. A control circuit as recited in claim 1 wherein said second predetermined voltage is greater than said first predetermined voltage.

3. A control circuit as recited in claim 1 wherein said first predetermined voltage is the supply voltage $V_{cc}$ for said IC.

4. A control circuit as recited in claim 1 wherein said predetermined internal circuit element is internally connected between a voltage supply pin and an input pin and said voltage supply $V_{cc}$ is connected to said supply pin.

5. A control circuit as recited in claim 4 wherein said second voltage generating means includes a predetermined resistive element connected on one end and a predetermined voltage source connected on an opposing end of said resistive element.

6. A control circuit as recited in claim 5, wherein said predetermined resistive element and said predetermined voltage source are selected to generate a voltage greater than said supply voltage.

7. A control circuit as recited in claim 5, wherein said resistive element and said predetermined voltage source are selected to limit the input current to the input pin to a predetermined value.

8. A method for measuring the internal die temperature of an integrated circuit (IC) having an internal circuit element which has an electrical characteristic which varies as a function of temperature, connected between two or more output pins comprising the steps of:

(a) supplying a first voltage to one of said output supply pins;

(b) supplying a second voltage to the other of said output supply pins;

(c) measuring the voltage difference between said first voltage and said second voltage, and generating a signal that is representative of the die temperature of said IC; and (d) controlling the clock frequency of said IC as a function of said die temperature representative signal.

9. A method for optimizing the utility of an integrated circuit (IC) having an internal circuit element which has an electrical characteristic that varies as a function of temperature connected between two or more output pins comprising the steps of:

(a) applying a first voltage to an output pin connected to one end of said internal circuit element;

(b) applying a second relatively higher voltage to an output pin connected to an opposing end of said internal circuit element;

(c) measuring the difference between said first voltage and said second voltage to generate a signal representative of the die temperature of said IC: and (d) controlling the clock frequency of said IC as a function of said die temperature representative signal.

10. A method as recited in claim 9 wherein step (d) includes the steps of decreasing the clock frequency applied to said IC when said die temperature representative signal is greater than a predetermined threshold.

11. A method as recited in claim 10 wherein step (d) further includes the step of increasing the clock frequency to said IC when said die temperature representative signal is less than a predetermined threshold.

12. A control circuit for optimizing the utility of an integrated circuit (IC) having an internal circuit element which has an electrical characteristic that varies as a function of temperature, said circuit element being connected to two or more output pins; said control circuit comprising;

means for applying a first predetermined voltage to a first output pin connected to one end of said internal circuit element;

means for applying a second predetermined voltage to a second output pin connected to an opposing end of said internal circuit element;

means or measuring the voltage difference between said first predetermined voltage and said second predetermined voltage and generating a signal representative of the internal temperature of said IC; and means for controlling the clock frequency of said IC as a function of said internal temperature representative signal.

13. A control circuit as recited in claim 12 wherein said first applying means includes means for connecting a predetermined supply voltage to said first output pin.

14. A control circuit as recited in claim 13 wherein said second applying means includes means for generating a second relatively higher voltage at said second output pin.

15. A control circuit as recited in claim 13 wherein said generating means includes a resistive element connected between said second output pin and a predetermined voltage source; said resistive element and said predetermined voltage source being selected such that the voltage at said second output pin is relatively larger than the voltage at said first output pin.

16. A control circuit as recited in claim 12 wherein said controlling means includes means for decreasing the clock frequency of the IC when said internal temperature representative signal is greater than a predetermined threshold.

17. A control circuit as recited in claim 16 wherein said controlling means further includes means for increasing the clock frequency of the IC when said internal temperature representative signal is less than a predetermined threshold.

* * * * *

UNITED STATES PATENT AND TRADEMARK OFFICE
CERTIFICATE OF CORRECTION

PATENT NO. : 5,498,971
DATED : March 12, 1996
INVENTOR(S) : Turnbull et al.

It is certified that error appears in the above-indentified patent and that said Letters Patent is hereby corrected as shown below:

Column 6, line 43, after "IC" insert --;--;

Column 6, line 59, delete "clement" and insert --element-- therefor;

Column 7, line 28, delete ":" and insert --;-- therefor;

Column 8, line 2, delete the second occurrence of ";" and insert --:-- therefor; and Column 8, line 9, delete "or" and insert --for-- therefor.

Signed and Sealed this

Eleventh Day of June, 1996

Attest:

BRUCE LEHMAN

*Attesting Officer*          *Commissioner of Patents and Trademarks*